US009425747B2

(12) United States Patent
Bazarjani et al.

(10) Patent No.: US 9,425,747 B2
(45) Date of Patent: Aug. 23, 2016

(54) SYSTEM AND METHOD OF REDUCING POWER CONSUMPTION FOR AUDIO PLAYBACK

(75) Inventors: Seyfollah Bazarjani, San Diego, CA (US); Guoqing Miao, San Diego, CA (US); Joseph R. Fitzgerald, San Diego, CA (US); Prajakt V. Kulkarni, San Diego, CA (US); Justin Joseph Rosen Gagne, San Diego, CA (US); Gene H. McAllister, La Mesa, CA (US); Jeffrey Hinrichs, San Diego, CA (US); Jan Paul van der Wagt, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1592 days.

(21) Appl. No.: 12/041,414

(22) Filed: Mar. 3, 2008

(65) Prior Publication Data

US 2009/0220110 A1 Sep. 3, 2009

(51) Int. Cl.
*H03F 99/00* (2009.01)
*H03G 3/00* (2006.01)
(Continued)

(52) U.S. Cl.
CPC ............ *H03F 1/0222* (2013.01); *H03F 1/0211* (2013.01); *H03G 3/30* (2013.01); *H03G 3/3005* (2013.01); *H03F 2200/03* (2013.01); *H03G 3/32* (2013.01)

(58) Field of Classification Search
CPC ..... H03F 1/025; H03F 1/0244; H03F 1/0211; H03F 1/0222; H03F 1/0227; H03F 2200/03; H03F 2200/102; H03F 2200/331; H03F 2200/351; H03F 2200/504; H03F 2200/511; H03F 3/68; H03F 3/72; H03F 3/181; H03F 3/217; H03F 3/2173; H03F 3/2171; H03G 3/001; H03G 3/002; H03G 3/04; H03G 3/32; H03G 3/3005; H03G 1/0088; H04H 60/04

USPC ................ 381/120, 104–109, 56–59; 700/94; 330/297, 199, 10, 251, 207 A, 296; 332/108, 109, 119, 120, 185
See application file for complete search history.

(56) References Cited

U.S. PATENT DOCUMENTS 3,700,871 A 10/1972 Montgomery, Jr. et al.
3,813,609 A 5/1974 Wilkes et al.
(Continued)

FOREIGN PATENT DOCUMENTS

CN 1722611 A 1/2006
CN 101009464 A 8/2007
(Continued)

OTHER PUBLICATIONS

International Search Report and Written Opinion—PCT/US2009/035917, International Search Authority—European Patent Office—Nov. 11, 2009.
(Continued)

*Primary Examiner* — Xu Mei
(74) *Attorney, Agent, or Firm* — Elaine H. Lo

(57) ABSTRACT

A system and method of improving the efficiency in the power consumption of an audio system. In essence, the technique is to adjust the power delivered from the power supply to the analog section, such as the power amplifier, in response to the volume level indicated by the volume control module and/or in response to the detected characteristic of the input audio signal. Thus, in this manner, the analog section is operated in a manner that is related to the level of the signal it is processing. Additionally, the system and method also relate to a technique of adjusting the dynamic ranges of the digital signal and the analog signal to improve the overall dynamic range of the system without needing to consume additional power.

47 Claims, 7 Drawing Sheets

(51) Int. Cl.
*H03F 1/02* (2006.01)
*H03G 3/30* (2006.01)
*H03G 3/32* (2006.01)

(56) References Cited

U.S. PATENT DOCUMENTS

| | | | |
|---|---|---|---|
| 4,355,304 A | 10/1982 | Kasuga et al. | |
| 4,507,619 A | 3/1985 | Dijkstra et al. | |
| 4,771,267 A | 9/1988 | Russell, Jr. et al. | |
| 5,442,317 A | 8/1995 | Stengel | |
| 5,442,711 A * | 8/1995 | Toyama | 381/63 |
| 5,541,600 A | 7/1996 | Blumenkrantz et al. | |
| 5,777,519 A | 7/1998 | Simopoulos | |
| 5,821,889 A | 10/1998 | Miller | |
| 6,088,461 A | 7/2000 | Lin et al. | |
| 6,226,193 B1 | 5/2001 | Bayer et al. | |
| 6,236,394 B1 | 5/2001 | Ikeda | |
| 6,240,191 B1 * | 5/2001 | Yoon | 381/109 |
| 6,353,404 B1 | 3/2002 | Kuroiwa | |
| 6,411,531 B1 | 6/2002 | Nork et al. | |
| 6,489,909 B2 | 12/2002 | Nakao et al. | |
| 6,504,422 B1 | 1/2003 | Rader et al. | |
| 6,522,273 B1 | 2/2003 | Fei et al. | |
| 6,531,902 B1 | 3/2003 | Tennen et al. | |
| 6,657,875 B1 | 12/2003 | Zeng et al. | |
| 6,763,114 B1 * | 7/2004 | Nalbant | 381/120 |
| 6,995,995 B2 | 2/2006 | Zeng et al. | |
| 7,027,482 B1 * | 4/2006 | Nomura | 375/130 |
| 7,110,559 B2 | 9/2006 | Behboodian et al. | |
| 7,224,591 B2 | 5/2007 | Kaishita et al. | |
| 7,250,810 B1 | 7/2007 | Tsen | |
| 7,271,642 B2 | 9/2007 | Chen et al. | |
| 7,385,443 B1 | 6/2008 | Denison | |
| 7,411,799 B2 | 8/2008 | Muggler et al. | |
| 7,453,316 B2 | 11/2008 | Shimizu | |
| 7,456,677 B1 | 11/2008 | Rao et al. | |
| 7,505,824 B2 * | 3/2009 | Ebi et al. | 700/94 |
| 7,554,385 B2 | 6/2009 | Ishida | |
| 7,583,149 B2 * | 9/2009 | Funaki et al. | 330/297 |
| 7,583,213 B2 | 9/2009 | Wang et al. | |
| 7,623,053 B2 | 11/2009 | Terry et al. | |
| 7,679,435 B2 | 3/2010 | Tsuji et al. | |
| 7,746,676 B2 | 6/2010 | Feng et al. | |
| 7,782,141 B2 | 8/2010 | Witmer et al. | |
| 7,830,209 B1 | 11/2010 | Woodford et al. | |
| 7,847,621 B2 | 12/2010 | Oyama et al. | |
| 8,189,802 B2 | 5/2012 | Miao et al. | |
| 8,295,510 B2 * | 10/2012 | Lin | 381/105 |
| 8,373,506 B2 * | 2/2013 | Lesso et al. | 330/297 |
| 2003/0098805 A1 | 5/2003 | Bizjak | |
| 2004/0141558 A1 | 7/2004 | Plisch et al. | |
| 2005/0147262 A1* | 7/2005 | Breebaart | 381/106 |
| 2005/0270086 A1 | 12/2005 | Sohara | |
| 2006/0006855 A1 | 1/2006 | Feng et al. | |
| 2006/0092063 A1 | 5/2006 | Ido et al. | |
| 2007/0024347 A1 | 2/2007 | Nagasawa et al. | |
| 2007/0159233 A1 | 7/2007 | Sohara | |
| 2007/0249304 A1* | 10/2007 | Snelgrove et al. | 455/127.2 |
| 2007/0279021 A1 | 12/2007 | Yanagida et al. | |
| 2008/0044041 A1 | 2/2008 | Tucker et al. | |
| 2008/0088179 A1 | 4/2008 | Oyama et al. | |
| 2008/0123873 A1* | 5/2008 | Bjorn-Josefsen et al. | 381/106 |
| 2008/0161108 A1* | 7/2008 | Dahl et al. | 463/35 |
| 2009/0051429 A1 | 2/2009 | Shen et al. | |
| 2009/0154442 A1 | 6/2009 | Kang et al. | |
| 2010/0026374 A1 | 2/2010 | Jung | |
| 2010/0219888 A1 | 9/2010 | Lesso | |
| 2010/0253420 A1 | 10/2010 | Xiao et al. | |
| 2010/0259330 A1 | 10/2010 | Nakai et al. | |
| 2010/0277152 A1 | 11/2010 | MacFarlane | |
| 2011/0204961 A1 | 8/2011 | Galal et al. | |
| 2011/0274295 A1 | 11/2011 | Motoki | |
| 2012/0133411 A1 | 5/2012 | Miao et al. | |
| 2012/0235730 A1 | 9/2012 | Quan et al. | |

FOREIGN PATENT DOCUMENTS

| | | |
|---|---|---|
| CN | 101014209 A | 8/2007 |
| CN | 101123398 A | 2/2008 |
| CN | 101611531 A | 12/2009 |
| CN | 101809862 A | 8/2010 |
| DE | 19963648 A1 | 7/2001 |
| EP | 0144143 A2 | 6/1985 |
| GB | 2444988 A | 6/2008 |
| JP | 56131210 | 10/1981 |
| JP | S56131209 A | 10/1981 |
| JP | 57023309 A | 2/1982 |
| JP | 58084509 A | 5/1983 |
| JP | H05226943 A | 9/1993 |
| JP | 6061753 A | 3/1994 |
| JP | 6314936 A | 11/1994 |
| JP | H0793579 A | 4/1995 |
| JP | 10014218 A | 1/1998 |
| JP | H10341114 A | 12/1998 |
| JP | 2000349640 A | 12/2000 |
| JP | 2002043874 A | 2/2002 |
| JP | 2002064339 A | 2/2002 |
| JP | 2005348561 A | 12/2005 |
| JP | 2006033204 A | 2/2006 |
| JP | 2006129366 A | 5/2006 |
| JP | 2006516377 A | 6/2006 |
| JP | 2006518131 A | 8/2006 |
| JP | 2006518133 A | 8/2006 |
| JP | 2007336753 A | 12/2007 |
| JP | 2010536197 A | 11/2010 |
| TW | 200300307 | 5/2003 |
| WO | WO9960524 A1 | 11/1999 |
| WO | WO2004091091 A1 | 10/2004 |
| WO | 2006043479 A1 | 4/2006 |
| WO | WO2006102313 A2 | 9/2006 |
| WO | 2008024655 A2 | 2/2008 |
| WO | 2008024666 A2 | 2/2008 |
| WO | 2009019459 A1 | 2/2009 |
| WO | 2009074779 A1 | 6/2009 |

OTHER PUBLICATIONS

Taiwan Search Report—TW098106872—TIPO—Mar. 4, 2012.
Gaalaas E.,"Class D Audio Amplifiers: What, Why, and How", Analog Dialogue, Analog Devices, vol. 40, No. 2, Jan. 7, 2010.
Ido T., et al., "A Digital Input Controller for Audio Class-D Amplifiers with 100W 0.004% THD+N and 113dB DR", ISSCC 2006, Session 19, Analog Techniques, 19.3, pp. 1-10, Feb. 7, 2006.
Jakonis, D., et al., "A 2.4-GHz RF sampling receiver front-end in 0.18-μm CMOS," Solid-State Circuits, IEEE Journal of, vol. 40, No. 6, pp. 1265-1277, Jun. 2005.
Su, David K., et al., "A CMOS Oversampling D/A Converter With a Current-Mode Semidigital Reconstruction Filter" IEEE Journal of Solid-State Circuits, IEEE Service Center, Piscataway, NJ, US LNKD—DOI:10.1109/4.261996, vol. 28, No. 12, Dec. 1, 1993, pp. 1224-1233, XP000435895.

* cited by examiner

US 9,425,747 B2

SYSTEM AND METHOD OF REDUCING POWER CONSUMPTION FOR AUDIO PLAYBACK

BACKGROUND

1. Field

The present disclosure relates generally to audio systems, and more specifically, to a system and method of reducing power consumption in an audio system by adjusting the power supplied to an audio power amplifier based on the volume level indicated by a volume control module and/or the envelope of the input audio signal.

2. Background

The output of a typical audio system consists of a digital section followed by an analog section. For example, the digital section may include a digital signal processor (DSP) adapted to receive an input digital audio signal, and apply some predetermined signal processing upon the input digital signal. The output of the digital section is coupled to the input of the analog section. The analog section may include a digital-to-analog converter (DAC) adapted to convert the digital audio signal received from the digital section into an analog audio signal. The analog section may also include a power amplifier (PA), such as a class A, A/B, D, E or G power amplifier, adapted to increase the power level of the analog audio signal to sufficiently drive a speaker. This is explained in more detail with reference to the following example.

FIG. 1A illustrates a block diagram of an exemplary conventional audio system 100. In this example, the audio system 100 is configured to generate a stereo output. The left channel section of the stereo output includes a DSP 102-L adapted to receive a left-channel N-bit input audio digital signal and perform some predetermined signal processing upon the signal, a DAC 104-L adapted to convert the digital audio signal received from the DSP 102-L into an analog audio signal, and a power amplifier (PA) 106-L adapted to increase the power level of the analog audio signal to sufficiently drive a left-channel speaker 108-L. The right-channel section of the stereo output includes a DSP 102-R, a DAC 104-R, and a power amplifier (PA) 106-R, and may be configured similar to the left-channel section, except that it acts upon a right-channel N-bit input digital audio signal to generate an analog audio signal with sufficient power to drive a right-channel speaker 108-R.

Generally, the power supply for the digital section is configured differently than the power supply for the analog section. For example, the power supply for the digital section may produce a relatively low supply voltage of approximately 1.2 Volts. Whereas, the power supply for the analog section may produce a higher supply voltage of approximately 3.3 Volts. Both supply voltages are generally fixed. The analog power supply is typically configured to provide power to the analog section such that the analog section can support the maximum audio signal amplitude. However, the analog signal amplitude is usually not at its maximum amplitude. Accordingly, this results in inefficiency in the power used by the audio system 100. This is explained in more detail with reference to the following example.

FIG. 1B illustrates a block diagram of the left-channel of the conventional audio system 100, as discussed above. Additionally, in this diagram, a power supply 110 for supplying power to the digital section, DSP 102-L, is shown. Also, a power supply 112 for supplying power to the analog section, DAC 104-L and power amplifier (PA) 106-L, is shown. As discussed above, the power supply 112 is configured to provide sufficient power to the DAC 104-L and power amplifier 106-L such that these devices can handle the maximum audio signal amplitude. Further, the bias currents for these devices are typically chosen for worst case scenario.

This results in inefficiency in the power consumed by the audio system 100 if the analog section is supporting an audio signal with an amplitude less than the maximum supported amplitude. For instance, this is true if the volume control of the audio system 100 is set to lower than the maximum volume. Additionally, since many audio content, such as music, have moments of high and low signal amplitude, the efficiency of the power consumed by the audio system 100 is lower at low audio signal amplitude.

SUMMARY

An aspect of the disclosure relates to a technique of improving the efficiency in the power consumption of an audio system. In essence, the technique is to adjust the power delivered from the power supply to the analog section, such as a power amplifier, in response to the volume level indicated by a volume control module and/or in response to the detected characteristic of the input audio signal. Thus, in this manner, the analog section is operated in accordance with the level of the signal it is processing. Additionally, the system and method also relate to a technique of adjusting the dynamic ranges of the digital signal and the analog signal to improve the overall dynamic range of the system without needing to consume additional power.

For instance, at relatively high audio signal levels, the power delivered to the analog section is relatively high. At relatively low audio signal levels, the power delivered to the analog section is relatively low. This improves the power consumption efficiency over that of a system that always delivers power to the analog section per the maximum signal level, regardless of the actual signal level being handled by the analog section.

In one exemplary embodiment, an audio system comprises an audio amplifier adapted to amplify a first analog audio signal to generate a second analog audio signal; a power supply adapted to supply power to the audio amplifier; a volume control module adapted to generate a signal indicating a volume level related to the second analog audio signal; and a control module adapted to control an amount of power delivered by the power supply to the audio amplifier in response to the volume level signal.

In another exemplary embodiment, an audio system comprises an audio amplifier adapted to amplify a first analog audio signal to generate a second analog audio signal; a power supply adapted to supply power to the audio amplifier; a detection module adapted to generate a signal related to a characteristic of the first analog audio signal; and a control module adapted to control an amount of power delivered by the power supply to the audio amplifier in response to the characteristic indicating signal.

In yet another exemplary embodiment, an audio system comprises an audio amplifier adapted to amplify a first analog audio signal to generate a second analog audio signal; a power supply adapted to supply power to the audio amplifier; a volume control module adapted to generate a signal indicating a volume level related to the second analog audio signal; a detection module adapted to generate a signal related to a characteristic of the first analog audio signal; and a control module adapted to control an amount of power delivered by the power supply to the audio amplifier in response to the volume level and characteristic indicating signals.

Continuing, in another exemplary embodiment, an audio system comprises a digital companding module adapted to receive a first digital audio signal, and generate a second digital audio signal being a product of the first digital audio signal and a digital gain parameter $G_D$; a digital-to-analog (DAC) converter adapted to generate a first analog audio signal derived from the second digital audio signal; an analog companding module adapted to receive the first analog audio signal, and generate a second analog audio signal being a product of the first analog audio signal and an analog gain parameter $G_A$; and a controller adapted to adjust the digital gain parameter $G_D$ and the analog gain parameter $G_A$ in response to a characteristic of the first digital audio signal.

Other aspects, advantages and novel features of the present disclosure will become apparent from the following detailed description of the disclosure when considered in conjunction with the accompanying drawings.

DETAILED DESCRIPTION

Figure 1A:
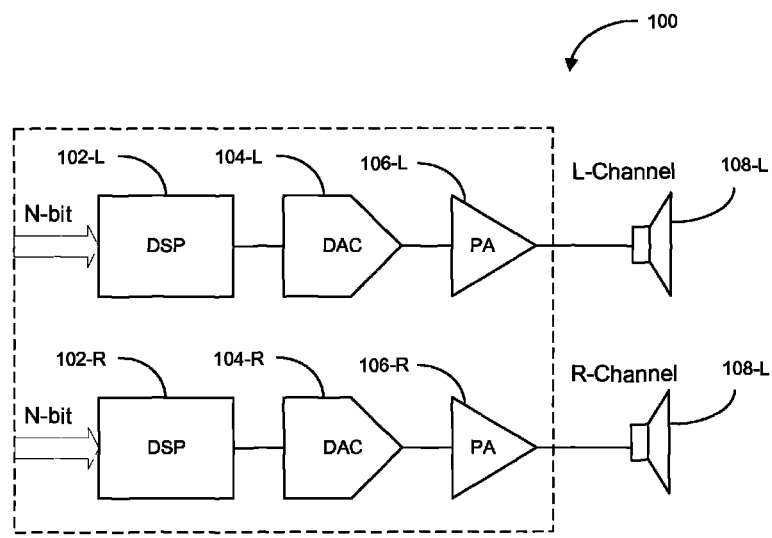
FIG. 1A illustrates a block diagram of an exemplary conventional audio system.
Figure 1B:
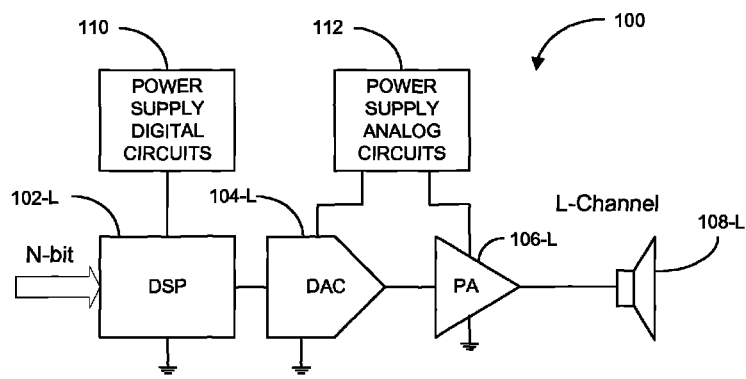
FIG. 1B illustrates a block diagram of the left-channel of the conventional audio system.
Figure 2:
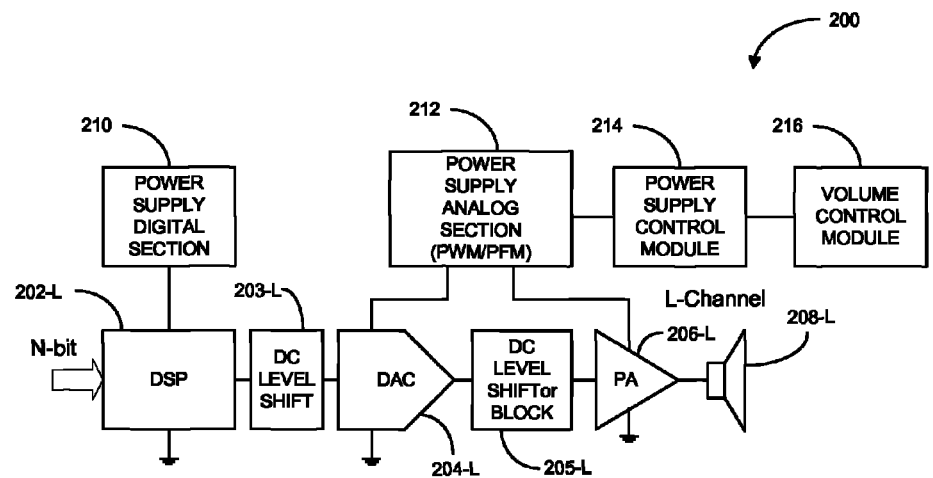
FIG. 2 illustrates a block diagram of an exemplary audio system in accordance with an aspect of the disclosure.

FIG. 2 illustrates a block diagram of an exemplary audio system 200 in accordance with an aspect of the disclosure. In this example, only the left-channel section of the audio system 200 is shown for illustrative purposes. It shall be understood that the concepts described herein are applicable to a right-channel section of the audio system 200, or to any or other audio channel that may be present in an audio system. For example, the concepts described herein are applicable to mono, stereo, surround sound, and other types of audio systems.

In particular, the audio system 200 comprises a digital section including, for example, a digital signal processor (DSP) 202-L. It shall be understood that the digital section may include other or different components. The audio system 200 also comprises an analog section, including a digital-to-analog converter (DAC) 204-L and a power amplifier (PA) 206-L. The power amplifier (PA) may be configured as an A, A/B, D, E, G or other class amplifier. As with the digital section, it shall be understood that the analog section may include other or different components.

If the digital section power supply 210 supplies a Vdd voltage to the DSP 202-L that is different than the Vdd voltage supplied to the DAC 204-L by the analog section power supply 212, a DC level shift 203-L may be provided between the DSP 202-L and DAC 204-L to provide the appropriate DC level shift. Similarly, if the analog section power supply 212 supplies a Vdd voltage to the DAC 204-L that is different than the Vdd voltage that it supplies to the power amplifier (PA) 206-L, a DC level shift or block 205-L may be provided between the DAC 204-L and the power amplifier (PA) 206-L to provide the appropriate DC level shift or block.

In this example, the DSP 202-L receives an input N-bit digital audio signal, and performs one or more predetermined processes upon the input signal. The DAC 204-L converts the digital audio signal received from the DSP 202-L into an analog audio signal. The power amplifier (PA) 206-L amplifies the analog audio signal, in accordance with an indicated volume level as discussed in more detail below, to a sufficient level to drive an L-channel speaker 208-L.

The audio system 200 further comprises a power supply 210 for supplying power to the digital section (e.g., the DSP 202-L). Additionally, the audio system 200 comprises a power supply 212 for supplying power to the analog section (e.g., DAC 204-L and power amplifier (PA) 206-L). The power supply 212 may deliver direct current (DC) power to the analog section. Alternatively, or in addition to, the power supply 212 may deliver power to the analog section via non-DC techniques, such as by pulse width modulation (PWM) or pulse frequency modulation (PFM). As discussed above, the power supply 212 may supply power differently to the DAC 204-L than it does to the power amplifier (PA) 206-L. In such a case, the control module 214 may instruct the power supply 212 to generate PWM power when the indicated volume level is above a predetermined threshold, and to generate PFM power when the indicated volume level is below the predetermined threshold.

The audio system 200 further includes a power supply control module 214 to control the amount of power delivered to the analog section by the power supply 212 in response to a volume control module 216. In order to improve the efficiency in the power consumption of the audio system 200, the power supply control module 214 controls the power supply 212 so that the power delivered to the analog section is related to the current volume level indicated by the volume control module 216. The relationship between the power supplied to the analog section and the current volume level could be substantially linear or non-linear.

As an example, if the current volume level indicated by the volume control module 216 is at the maximum volume level, the power supply control module 214 may control the power supply 212 to supply a voltage of approximately 3.3 Volts to the analog section. If the user lowers the volume to 50% of the maximum volume level as indicated by the volume control module 216, the power supply control module 214 controls the power supply 212 to supply a voltage of approximately 2.2 Volts to the analog section.

As another example, if the current volume level indicated by the volume control module 216 is at the maximum volume level, the power supply control module 214 may control the power supply 212 to supply a PWM signal having an 85% duty cycle to the analog section. If the user lowers the volume to 50% of the maximum volume level as indicated by the volume control module 216, the power supply control module 214 controls the power supply 212 to supply a PWM signal having a 55% duty cycle to the analog section.

As yet another example, if the current volume level indicated by the volume control module 216 is at the maximum volume level, the power supply control module 214 may control the power supply 212 to supply a PFM signal with a frequency of 300 MHz to the analog section. If the user lowers the volume to 50% of the maximum volume level as indicated by the volume control module 216, the power supply control module 214 controls the power supply 212 to supply a PFM signal with a frequency of 255 MHz to the analog section.

Figure 3:
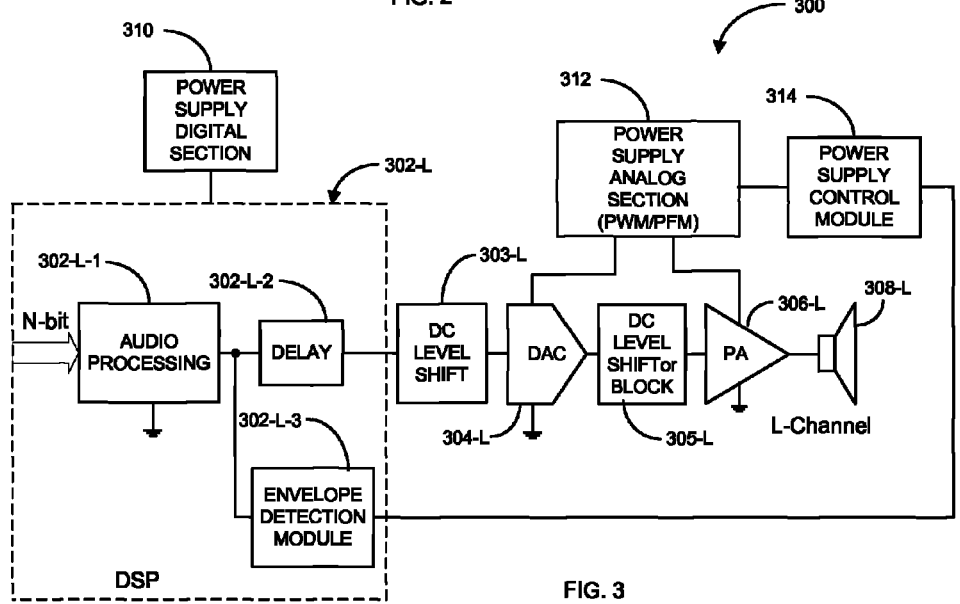
FIG. 3 illustrates a block diagram of another exemplary audio system in accordance with another aspect of the disclosure.

FIG. 3 illustrates a block diagram of another exemplary audio system 300 in accordance with another aspect of the disclosure. In the prior example, the power supply control module controls the power supply for the analog section in response to the volume level indicated by the volume control module 216. In this example, a power supply control module controls the power supply for the analog section in response to the detected envelope of the input audio signal. This improves the power consumption efficiency of the audio system 300 in response to the dynamics of the input audio signal.

As with the prior example, only the left-channel section of the audio system 300 is shown for illustrative purposes. It shall be understood that the concepts described herein are applicable to a right-channel section of the audio system 300, or to any or other audio channel that may be present in an audio system. As previously discussed, the concepts described herein are applicable to mono, stereo, surround sound, and other types of audio systems.

In particular, the audio system 300 comprises a digital section including a digital signal processor (DSP) 302-L for performing particular audio processing upon an input N-bit digital audio signal, as discussed in more detail below. The audio system 300 further comprises an analog section including a digital-to-analog (DAC) converter 304-L to convert the digital audio signal received from the DSP 302-L into an analog audio signal, and a power amplifier (PA) to increase the amplitude of the analog audio signal, in response to a power supply control module that is responsive to the envelope of the input digital audio signal, to sufficiently drive an L-channel speaker 308-L.

The audio system 300 further comprises a power supply 310 for supplying power to the digital section, such as the DSP 302-L. Additionally, the audio system 300 comprises a power supply 312 to supply power to the analog section, such as the DAC 304-L and power amplifier (PA) 306-L. As with the prior example, the power supply 312 may deliver direct current (DC) power to the analog section. Alternatively, or in addition to, the power supply 312 may deliver power to the analog section via non-DC techniques, such as by pulse width modulation (PWM) or pulse frequency modulation (PFM). As previously discussed, the power supply 312 may supply power differently to the DAC 304-L than it does to the power amplifier (PA) 306-L. In such a case, the control module 314 may instruct the power supply 312 to generate PWM power when the level indicated by the envelope signal is above a predetermined threshold, and to generate PFM power when the level indicated by the envelope signal is below the predetermined threshold.

If the digital section power supply 310 supplies a Vdd voltage to the DSP 302-L that is different than the Vdd voltage supplied to the DAC 304-L by the analog section power supply 312, a DC level shift 303-L may be provided between the DSP 302-L and DAC 304-L to provide the appropriate DC level shift. Similarly, if the analog section power supply 312 supplies a Vdd voltage to the DAC 304-L that is different than the Vdd voltage that it supplies to the power amplifier (PA) 306-L, a DC level shift or block 305-L may be provided between the DAC 304-L and the power amplifier (PA) 306-L to provide the appropriate DC level shift or block.

The audio system 300 further includes a power supply control module 314 to control the amount of power delivered to the analog section by the power supply 312 in response to the detected envelope of the input digital audio signal. More specifically, the DSP 302-L comprises an audio processing module 302-L-1 adapted to perform a specified processing to the input N-bit digital audio signal. The DSP 302-L further comprises an envelope detection module 302-L-3 adapted to generate a signal related to the current envelope of the input digital audio signal. The power supply control module 314 then controls the power supply 312 in response to the signal generated by the envelope detection module 302-L-3. The DSP 302-L further comprises a delay module 302-L-2 in order to compensate for the processing delay of the envelope detection module 302-L-3. The delay 302-L-2 ensures that the power delivered to the analog section timely corresponds to the envelope of the audio signal being processed by the analog section.

The envelope detection module 302-L-3 may detect the envelope of the input digital audio signal by buffering or storing k samples of the input digital audio signal. In one embodiment, the envelope detection module 302-L-3 determines the peak value of the k samples, and generates an envelope signal indicative of the peak value. In this manner, the power supply 312 is configured to supply power to handle the peak value. In another embodiment, the envelope detection module 302-L-3 performs an integration of the k-samples to determine an "average" amplitude level for the k-samples, and generates an envelope signal indicative of the "average" amplitude level of the k-samples. In this manner, some compromise in signal quality is afforded for lower power consumption. In yet another embodiment, the envelope detection module 302-L-3 determines a root mean square (RMS) value of the k-samples, and generates an envelope signal indicative of the RMS value of the k-samples. Similarly, with this embodiment, some compromise in signal quality is afforded for lower power consumption.

The power supply control module 314 may control the power supply 312 in response to the envelope-indicative signal generated by the envelope detection module 302-L-3. It shall be understood that the envelope detection module 302-L-3 may perform other algorithms to generate a signal related to the envelope of the input digital audio signal.

In order to improve the efficiency in the power consumption of the audio system 300, the power supply control module 314 controls the power supply 312 so that the power delivered to the analog section is related to the detected envelope of the input digital audio signal as indicated by the envelope detection module 302-L-3. The relationship between the power supplied to the analog section and the current envelope of the input digital audio signal could be substantially linear or non-linear.

Additionally, by the envelope detection module 302-L-3 knowing the k-samples of the input digital audio signal, the power supply control module 314 has pre-knowledge of whether the input signal is making a rapid transition from high to low, or low to high. In this way, the power supply control module 314 may control the power supply 312, such as in a slow manner, to avoid clicks and pops distortion from creeping into the output audio signal of the system 300. In some cases, for example that use a class D power amplifier (PA), the power supply rejection may be relatively poor. By having advance knowledge of the k-samples of the input digital audio signal, the power supply control module 314 may be configured to limit the rate of changing the power supplied by the power supply 312 to be lower than the human audible range (e.g., ≤10 Hz), so as to prevent distortion of the output audio signal.

Figure 4:
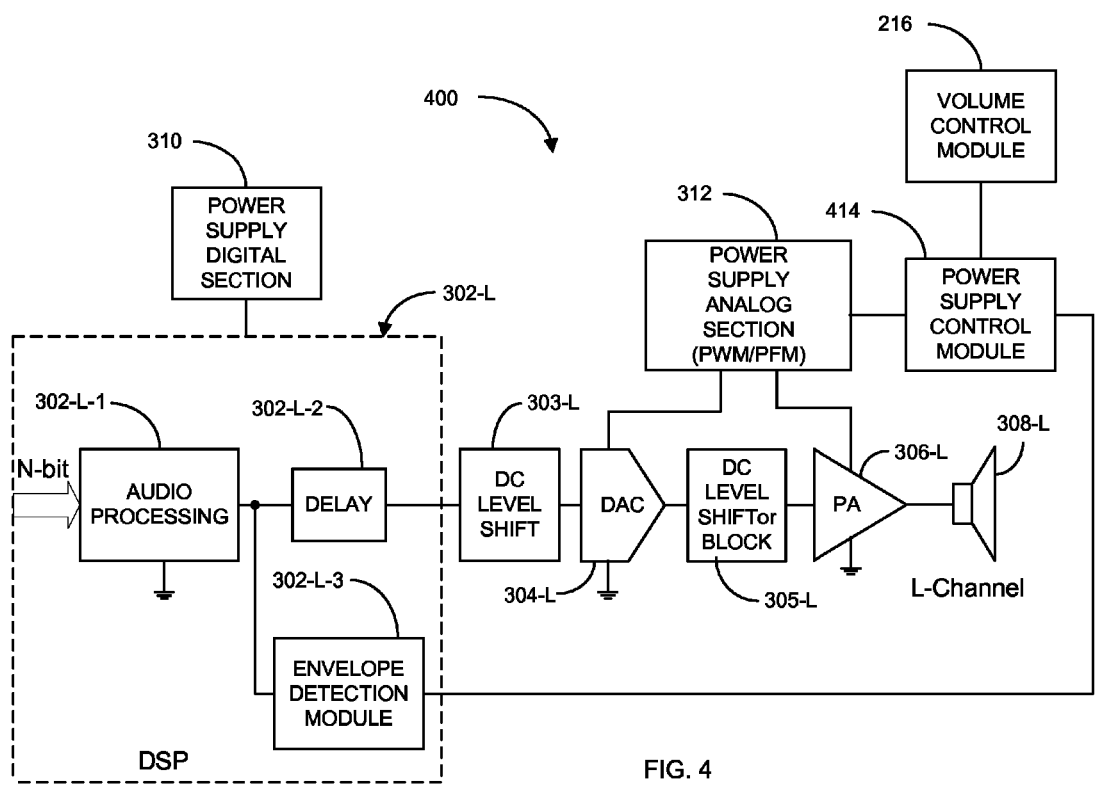
FIG. 4 illustrates a block diagram of yet another exemplary audio system in accordance with another aspect of the disclosure.

FIG. 4 illustrates a block diagram of yet another exemplary audio system 400 in accordance with another aspect of the disclosure. The audio system 400 is basically a combination of the previously-discussed audio systems 200 and 300. Thus, the audio system 400 includes a power supply control module 414 that controls the power delivered to the analog section by the power supply 312 in response to the volume level indicated by the volume control module 216 and the detected envelope of the input digital audio signal as indicated by the envelope detection module 302-L-3.

Figure 5:
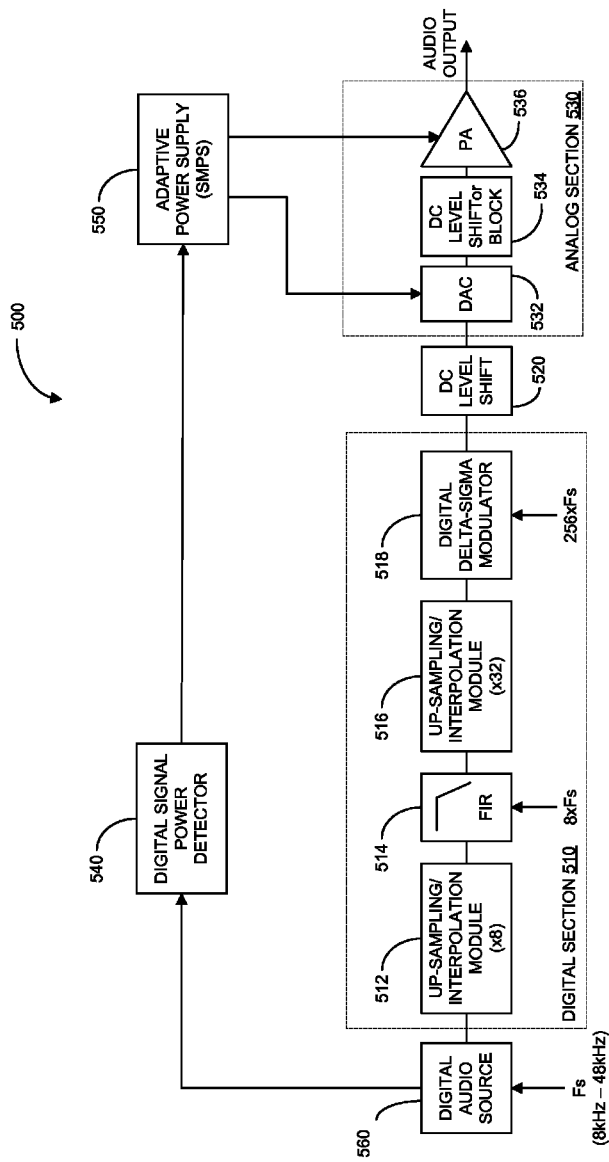
FIG. 5 illustrates a block diagram of still another audio system in accordance with another aspect of the disclosure.

FIG. 5 illustrates a block diagram of still another audio system 500 in accordance with another aspect of the disclosure. As discussed in more detail below, the audio system 500 is configured to generate an output analog audio signal in a power efficient manner. The audio system 500 comprises a digital audio section 510, an analog audio section 530, a digital signal power detector 540, an adaptive power supply 550 that may be configured, for example, as a switch mode power supply (SMPS), and a digital audio source 560 for generating an input digital audio signal.

The digital section 510, in turn, may comprise a first up-sampling interpolation module 512, a finite impulse response (FIR) filter 514, a second up-sampling interpolation module 516, and a digital delta-sigma modulator 518. The first up-sampling interpolation module 512 receives the input digital audio signal from the digital audio source 560, and produces a digital audio signal with a higher sampling rate. As an example, the input digital audio signal may have a sampling rate of 8 kHz to 48 kHz. The first up-sampling interpolation module 512 then uses an interpolation algorithm to generate a digital audio signal with a sampling rate eight (8) times higher (e.g., 64 kHz to 384 kHz). The FIR filter 514 receives the output of the first up-sampling interpolation module 512 and uses an oscillator signal with a frequency eight (8) times the sampling rate of the input digital audio signal to filter out image and other unwanted signals.

The second up-sampling interpolation module 516 receives the output signal from the FIR filter 516, and produces a digital audio signal with a higher sampling rate. As an example, the output digital audio signal from the FIR filter 514 may have a sampling, rate of 64 kHz to 384 kHz. The second up-sampling interpolation module 516 then uses an interpolation algorithm to generate a digital audio signal with a sampling rate 32 times higher (e.g., 2.048 MHz to 12.288 MHz). The digital delta-sigma modulator 518 performs an algorithm on the output digital audio signal from the second up-sampling interpolation module 516 to reduce the number of bits to quantify the digital audio signal generated by the digital section 510. It shall be understood that the digital section 510 may be configured in other manners. The digital section 510 described herein is merely one example.

The analog section 530, in turn, may comprise a digital-to-analog (DAC) 532 to convert the output digital audio signal from the digital section 510 into an analog audio signal. Additionally, the analog section 530 may further comprise a power amplifier (PA) 536 to increase the power of the analog audio signal form the DAC 532 to a sufficient level to drive a speaker. It shall be understood that the analog section 530 may be configured in other manners. The analog section 530 described herein is merely one example.

The digital signal power detector 540, in turn, receives the input digital audio signal from the digital audio source 560, and generates a signal indicative of the approximate power level of the input digital audio signal. The adaptive power supply 550 supplies power to the analog section 530 on the basis of the power-indicating signal generated by the digital signal power detector 540. In this configuration, the adaptive power supply 550 may supply power to the analog section in a power efficient manner. For example, when the power level of the input digital audio signal is relatively low as indicated by the signal generated by the digital signal power detector 540, the adaptive power supply 550 supplies relatively low power to the analog section 530. On the other hand, when the power level of the input digital audio signal is relatively high as indicated by the signal generated by the digital signal power detector 540, the adaptive power supply 550 supplies relatively high power to the analog section 530.

Figure 6:
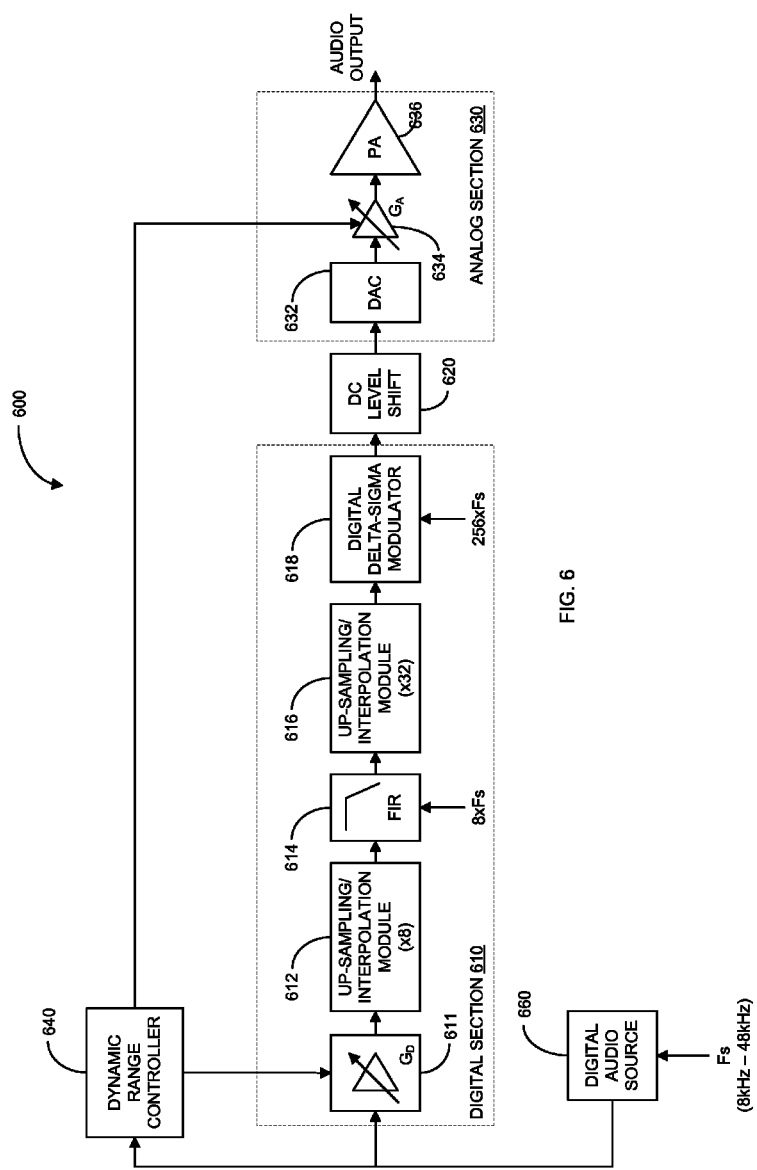
FIG. 6 illustrates a block diagram of still another audio system in accordance with another aspect of the disclosure.

FIG. 6 illustrates a block diagram of still another audio system 600 in accordance with another aspect of the disclosure. As discussed in more detail below, the audio system 600 increases the dynamic range of the input signal in a power efficient manner. In particular, the audio system 600 comprises a digital audio section 610, a DC level shift 620, an analog audio section 630, a dynamic range controller 640, and a digital audio source 660.

The digital section 610 may be configured similarly to the digital section 510 of the previous embodiment, and may include a first up-sampling interpolation module 612, an FIR filter 614, a second up-sampling interpolation module 616, and a digital delta-sigma modulator 618. Additionally, the digital section 610 comprises a digital companding module 611 to adjust the dynamic range of an input digital audio signal received from the digital audio source 660 in response to a control signal received from the dynamic range controller 640.

The analog section 630 may be configured similarly to the analog section 530 of the previous embodiment, and may include a DAC 632 and a power amplifier (PA) 636. Additionally, the analog section 630 includes an analog companding module 634 to adjust the dynamic range of the analog audio signal generated by the DAC 632 in response to a control signal received from the dynamic range controller 640. The DC level shift 620 may provide the appropriate DC level shifting if the digital and analog sections 610 and 620 are supplied with different Vdd voltages.

The dynamic range controller 640 is configured to receive the input digital audio signal from the digital audio source 660, determine the power of the input digital audio signal, and generate dynamic range control signals for the digital companding module 611 and the analog companding module 634 based on the detected power of the input digital audio signal. In particular, the dynamic range controller 640 may be configured to generate control signals such that the gain $G_D$ of the digital companding module 611 multiplied by the gain $G_A$ of the analog companding module 634 is substantially unity (e.g., $G_D \times G_A = 1$). Additionally, the dynamic range controller 640 may be configured to adjust the gain $G_D$ of the digital companding module 611 inversely with the detected power of the input digital audio signal. The minimum gain for the digital companding module 611 may be set to zero (0) dB. With this configuration, the audio system 600 is able to increase its dynamic range without increasing its power consumption, as explained in more detail with reference to the following example.

Figure 7:
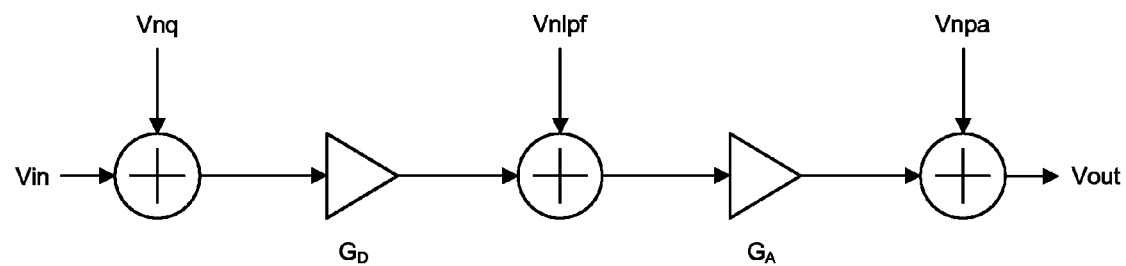
FIG. 7 illustrates a diagram of an exemplary noise model of the an audio system in accordance with another embodiment of the invention.

FIG. 7 illustrates a diagram of an exemplary noise model of the audio system 600. In the diagram, the variable Vin represents the input digital audio signal of the audio system 600, and the variable Vout represents the output analog audio signal of the audio system 600. Additionally, the variable Vnq represents the digital quantization noise of the input digital audio signal, the variable Vnlpf represents the noise due to the DAC 632, and Vnpa represents the noise due to the power amplifier 636. As discussed above, the gains of the digital companding module 611 and the analog companding module 634 are represented as $G_D$ and $G_A$, respectively.

The total noise power at the output of the audio system 600 may be represented by the following equation:

$$Vn^2 = (Vnq * G_D * G_A)^2 + (Vnlpf * G_A)^2 + Vnpa^2 \quad \text{Eq. 1}$$

As previously discussed, the dynamic range controller 640 controls the respective gains $G_D$ and $G_A$ of the digital and analog companding modules 611 and 634 such that their product is substantially unity. This may be represented as follows:

$$G_D * G_A = 1 \quad \text{Eq. 2}$$

Substituting Eq. 2 into Eq. 1, the total noise power at the output of the audio system 600 may be represented as:

$$Vn^2 = Vnq^2 + (Vnlpf * G_A)^2 + Vnpa^2 \quad \text{Eq. 3}$$

Generally, among the various devices of the audio system 600, the dominant noise source is typically from the DAC+SCLPF (i.e., Vnlpf).

When the power of the input digital audio signal is relatively small, the dynamic range controller 640 increases the gain $G_D$ of the digital companding module 611 (i.e., $G_D \gg 1$). At the same time, the dynamic range controller 640 decreases the gain GA of the analog companding module 634, such that the product of the gains $G_D$ and $G_A$ is substantially equal to unity (i.e., $G_A = 1/G_D \ll 1$). Because the gain $G_A$ of the analog companding module 634 is relatively small, the noise Vnlpf from the DAC 632 is greatly attenuated because the component $(Vnlpf * G_A)^2$ of the total output noise is relatively small. Thus, in this scenario, the total output noise can be approximated as follows:

$$Vn^2 \approx Vnq^2 + Vnpa^2 \quad \text{Eq. 4}$$

Thus, at relatively low power level of the input digital input signal, the total output noise of the audio system 600 is significantly reduced. At relatively high power level of the input digital audio signal, the noise becomes less a factor due to the high audio signal levels. Thus, the audio system 600 provides a relatively large dynamic range without increasing its power consumption to achieve this end.

Figure 8:
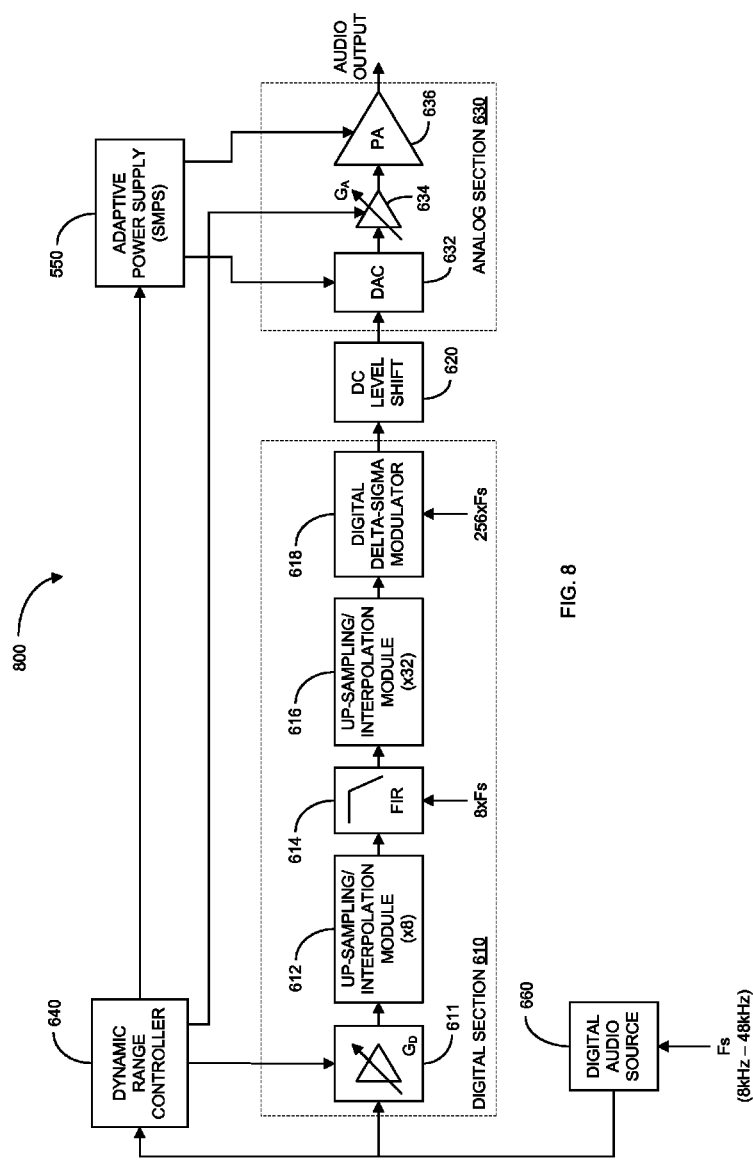
FIG. 8 illustrates a block diagram of still another audio system in accordance with another aspect of the disclosure.

FIG. 8 illustrates a block diagram of another exemplary audio system 800 in accordance with another aspect of the disclosure. Any of the embodiments described herein may be combined into a single audio system. For example, the embodiments that relate to controlling the amount of power delivered to the analog section in response to the volume control and/or a characteristic of the input audio signal as described with reference to FIGS. 2-5 may be combined with the audio companding embodiment described with reference to FIGS. 6-7. As an example, the audio system 800 comprises the audio system 600 that includes the audio compacting technique previously discussed, as well as the adaptive power supply 550 for controlling the amount of power delivered to the audio section (e.g., the DAC 632 and the PA 636) in response to the dynamic range controller 640. The dynamic range controller 640, in turn, controls the adaptive power supply 550 in response to a characteristic of the input signal audio signal from the digital audio source 660.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

While the invention has been described in connection with various aspects, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:

1. An audio system, comprising:
   an audio amplifier adapted to amplify a first analog audio signal to generate a second analog audio signal;
   a power supply adapted to supply power to the audio amplifier;
   an adjustable volume control module adapted to generate a volume level signal indicating a volume level for the second analog audio signal; and
   a control module adapted to control an amount of power delivered by the power supply to the audio amplifier, wherein the power to the audio amplifier being differently modulated depending on whether the volume level signal is above or below a predetermined threshold.

2. The audio system of claim 1, wherein the audio amplifier comprises a power amplifier.

3. The audio system of claim 2, wherein the power amplifier is configured as a class A, A/B, D, E or G power amplifier.

4. The audio system of claim 1, wherein the power supply is adapted to deliver direct current (DC) power to the audio amplifier, and wherein the control module is adapted to adjust a level of the DC power in response to the volume level signal.

5. The audio system of claim 1, wherein the power supply is adapted to deliver pulse width modulated (PWM) power to the audio amplifier, and wherein the control module is adapted to adjust a duty cycle of the PWM power in response to the volume level signal.

6. The audio system of claim 1, wherein the power supply is adapted to deliver pulse frequency modulated (PFM) power to the audio amplifier, and wherein the control module is adapted to adjust a frequency of the PFM power in response to the volume level signal.

7. The audio system of claim 1, wherein the power supply is adapted to deliver pulse width modulated (PWM) power to the audio amplifier when the volume level signal indicates a volume level above the predetermined threshold, and wherein the power supply is adapted to deliver pulse frequency modulated (PFM) power to the audio amplifier when the volume level signal indicates a volume level below the predetermined threshold.

8. The audio system of claim 1, wherein the control module is adapted to control the power supply such that the amount of power delivered to the audio amplifier varies substantially linear with the volume level indicated by the volume level signal.

9. The audio system of claim 1, wherein the control module is adapted to control the power supply such that the amount of power delivered to the audio amplifier varies non-linearly with the volume level indicated by the volume level signal.

10. The audio system of claim 1, further comprising a digital-to-analog converter (DAC) adapted to generate the first analog audio signal from a first digital audio signal.

11. The audio system of claim 10, further comprising a DC level shift or block situated between the DAC and the audio amplifier.

12. The audio system of claim 10, further comprising a digital signal processor (DSP) adapted to generate the first digital audio signal from a second digital audio signal.

13. The audio system of claim 12, wherein the DSP comprises a detection module adapted to generate a characteristic indicating signal indicative of a characteristic of the first digital audio signal.

14. The audio system of claim 13, wherein the control module is further adapted to control the amount of power delivered by the power supply to the audio amplifier in response to the characteristic indicating signal.

15. The audio system of claim 12, further comprising a DC level shift situated between the DSP and the DAC.

16. A method of operating an audio system, comprising:
amplifying a first analog audio signal to generate a second analog audio signal;
supplying power to cause the amplification of the first analog audio signal;
adjustably generating a volume level signal indicative of a volume level determined for second analog audio signal; and
controlling an amount of the power, wherein the power to cause the amplification being differently modulated depending on whether the volume level signal is above or below a predetermined threshold.

17. The method of claim 16, wherein the power includes direct current (DC) power, and wherein controlling the amount of the power comprises adjusting a level of the DC power in response to the volume level signal.

18. The method of claim 16, wherein the power includes pulse width modulated (PWM) power, and wherein controlling the amount of the power comprises adjusting a duty cycle of the PWM power in response to the volume level signal.

19. The method of claim 16, wherein the power includes pulse frequency modulated (PFM) power, and wherein controlling the amount of the power comprises adjusting a frequency of the PFM power in response to the volume level signal.

20. The method of claim 16, further comprising controlling the amount of the power in response to a signal related to a characteristic of the first analog audio signal.

21. An apparatus, comprising:
means for amplifying a first analog audio signal to generate a second analog audio signal;
means for supplying power to the amplification means;
means for adjustably generating a volume level signal indicative of a volume level for the second analog audio signal; and
means for controlling an amount of power delivered by the power supply means, wherein the power to the amplification means being differently modulated depending on whether the volume level signal is above or below a predetermined threshold.

22. The apparatus of claim 21, further comprising:
means for generating a signal related to an envelope of the first analog audio signal; and
means for controlling the amount of power delivered by the power supply means to the amplification means in response to the envelope signal.

23. An audio system, comprising:
an audio amplifier adapted to amplify a first analog audio signal to generate a second analog audio signal;
a power supply adapted to supply power to the audio amplifier;
a detection module adapted to sample a digital signal used to generate the first analog audio signal, the detection module further adapted to generate a characteristic indicating signal determined from an envelope of the first analog audio signal; and
a control module adapted to control an amount of power delivered by the power supply, wherein the power to the audio amplifier being differently modulated depending on whether the volume level signal is above or below a predetermined threshold.

24. The audio system of claim 23, wherein the power supply is adapted to deliver direct current (DC) power to the audio amplifier, and wherein the control module is adapted to adjust a level of the DC power in response to the characteristic indicating signal.

25. The audio system of claim 23, wherein the power supply is adapted to deliver pulse width modulated (PWM) power to the audio amplifier, and wherein the control module is adapted to adjust a duty cycle of the PWM power in response to the characteristic indicating signal.

26. The audio system of claim 23, wherein the power supply is adapted to deliver pulse frequency modulated (PFM) power to the audio amplifier, and wherein the control module is adapted to adjust a frequency of the PFM power in response to the characteristic indicating signal.

27. The audio system of claim 23, wherein the power supply is adapted to deliver pulse width modulated (PWM) power to the audio amplifier when the characteristic indicating signal indicates a level above the predetermined threshold, and wherein the power supply is adapted to deliver pulse frequency modulated (PFM) power to the audio amplifier when the characteristic indicating signal indicates a level below the predetermined threshold.

28. The audio system of claim 23, wherein the control module is adapted to control the power supply such that the amount of power delivered to the audio amplifier varies substantially linear or non-linear with a level indicated by the characteristic indicating signal.

29. The audio system of claim 23, further comprising a digital-to-analog converter (DAC) adapted to generate the first analog audio signal from a first digital audio signal.

30. The audio system of claim 29, further comprising a digital signal processor (DSP) adapted to generate the first digital audio signal from a second digital audio signal.

31. The audio system of claim 30, wherein the DSP includes the detection module.

32. The audio system of claim 30, wherein the detection module is adapted to generate the characteristic indicating signal by processing k-samples of the second digital audio signal.

33. The audio system of claim 32, wherein the characteristic indicating signal is related to a peak value of the k samples of the second digital audio signal, an average or integrated value of the k samples of the second digital audio signal, a root mean square (RMS) value of the k samples of the second digital audio signal, or a power level of at least one of the k samples of the second digital audio signal.

34. The audio system of claim 23, wherein the control module is adapted to control the amount of power delivered by the power supply to the audio amplifier at a rate that prevents clicks and pops distortion to creep into the second analog audio signal.

35. A method of operating an audio system, comprising:
amplifying a first analog audio signal to generate a second analog audio signal;
supplying power to cause the amplification of the first analog audio signal;
sampling a digital signal used to generate the first analog audio signal to generate a characteristic indicating signal indicating an envelope related to the first analog audio signal; and
controlling an amount of the power, wherein the power to cause the amplification being differently modulated depending on whether the characteristic indicating signal is above or below a predetermined threshold.

36. The method of claim 35, wherein the power includes direct current (DC) power, and wherein controlling the amount of the power comprises adjusting a level of the DC power in response to the characteristic indicating signal.

37. The method of claim 35, wherein the power includes pulse width modulated (PWM) power, and wherein controlling the amount of the power comprises adjusting a duty cycle of the PWM power in response to the characteristic indicating signal.

38. The method of claim 35, wherein the power includes pulse frequency modulated (PFM) power, and wherein controlling the amount of the power comprises adjusting a frequency of the PFM power in response to the characteristic indicating signal.

39. The method of claim 35, wherein controlling an amount of the power comprises controlling a rate of change of the power so as to prevent clicks and pops distortion from creeping into the second analog audio signal.

40. The method of claim 35, further comprising controlling the amount of the power in response to the signal indicative of a volume level related to the second analog audio signal.

41. An apparatus, comprising:
means for amplifying a first analog audio signal to generate a second analog audio signal;
means for supplying power to the amplification means;
means for generating a signal indicative of a characteristic related to the first analog audio signal;
means for sampling a digital signal used to generate the first analog audio signal to generate a characteristic indicating signal indicating an envelope related to the first analog audio signal; and
means for controlling an amount of power delivered by the power supply means, wherein the power to the means for amplifying being differently modulated depending on whether the characteristic indicating signal is above or below a predetermined threshold.

42. The apparatus of claim 41, further comprising:
means for generating a signal indicative of the volume level related to the first analog audio signal; and
means for controlling the amount of power delivered by the power supply means to the amplification means in response to the volume level signal.

43. An audio system, comprising:
a digital companding module adapted to receive a first digital audio signal, and generate a second digital audio signal being a product of the first digital audio signal and a digital gain parameter $G_D$;
a digital-to-analog (DAC) converter adapted to generate a first analog audio signal derived from the second digital audio signal;
an analog companding module adapted to receive the first analog audio signal, and generate a second analog audio signal being a product of the first analog audio signal and an analog gain parameter $G_A$;
an adaptive power supply adapted to supply power to the DAC or the power amplifier; and
a controller adapted to adjust the power supply, adjust the digital gain parameter $G_D$ and the analog gain parameter $G_A$ in response to a characteristic of the first digital audio signal, wherein the power being differently modulated depending on whether a volume level for the second analog audio signal is above or below a predetermined threshold.

44. The audio system of claim 43, wherein the characteristic of the first digital audio signal includes a power of the first digital audio signal.

45. The audio system of claim 44, wherein the controller is adapted to adjust the digital gain parameter $G_D$ inversely with the power of the first digital audio signal.

46. The audio system of claim 43, wherein the controller is adapted to adjust the digital gain parameter $G_D$ and the analog gain parameter $G_A$ such that the product of the digital gain parameter $G_D$ and the analog gain parameter $G_A$ is substantially equal to one (1).

47. The audio system of claim 43, further comprising a power amplifier adapted to amplify the second analog audio signal.

* * * * *